United States Patent
Pai et al.

(10) Patent No.: US 8,031,029 B2
(45) Date of Patent: Oct. 4, 2011

(54) DIFFERENTIAL SIGNAL TRANSMISSION CABLE AND METHOD FOR COMPENSATING LENGTH OFFSET THEREOF

(75) Inventors: Yu-Chang Pai, Taipei Hsien (TW); Chien-Hung Liu, Taipei Hsien (TW); Po-Chuan Hsieh, Taipei Hsien (TW); Pei-Chun Lin, Taipei Hsien (TW); Shou-Kuo Hsu, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 218 days.

(21) Appl. No.: 12/430,132

(22) Filed: Apr. 27, 2009

(65) Prior Publication Data

US 2010/0237961 A1    Sep. 23, 2010

(30) Foreign Application Priority Data

Mar. 17, 2009 (CN) .............................. 200910300910

(51) Int. Cl.
*H01P 3/08* (2006.01)
*H01P 3/04* (2006.01)
(52) U.S. Cl. ............................................. 333/4; 333/238

(58) Field of Classification Search .................. 333/1, 4, 333/5, 238
See application file for complete search history.

(56) References Cited

U.S. PATENT DOCUMENTS

| 5,777,526 A * | 7/1998 | Kawasaki ........................ 333/1 |
| 6,496,081 B1 * | 12/2002 | Govind et al. ............... 333/28 R |
| 2006/0290438 A1 * | 12/2006 | Greeff ............................... 333/1 |

* cited by examiner

*Primary Examiner* — Benny Lee
(74) *Attorney, Agent, or Firm* — Altis Law Group, Inc.

(57) ABSTRACT

A compensation method compensates for a length offset between a first transmission line and a second transmission line of a differential signal transmission. The compensation method includes calculating a transmission speed of a first signal in the first transmission line, measuring lengths of the first and second transmission lines, calculating a transmission time of the first signal in the first transmission line, and calculating a relationship between permittivity values of the first and second transmission lines. The compensation method further changes the permittivity values of the first and second transmission lines according to the relationship.

8 Claims, 7 Drawing Sheets

DIFFERENTIAL SIGNAL TRANSMISSION CABLE AND METHOD FOR COMPENSATING LENGTH OFFSET THEREOF

BACKGROUND

1. Technical Field

The present disclosure relates to differential signal transmission, and particularly to a differential signal transmission cable and a method for compensating a length offset of the differential signal transmission cable.

2. Description of the Related Art

Generally, common-mode noise in signals is rejected by using differential signal transmission in a differential signal transmission cable that has a first transmission line and a second transmission line. For high transmission quality, a differential signal pair reach reception terminals of the first and second transmission lines at substantially the same time so as to have the same phase. However, layout of electrical elements positioned on a printed circuit board normally cause the first and second transmission lines unequal in length, generating different transmission time for the differential signal pair. Popular length compensation methods for differential signal transmission cables still cannot enable lengths of the first and second transmission lines to equal each other, which reduces signal transmission quality.

DETAILED DESCRIPTION OF THE INVENTION

Figure 1:
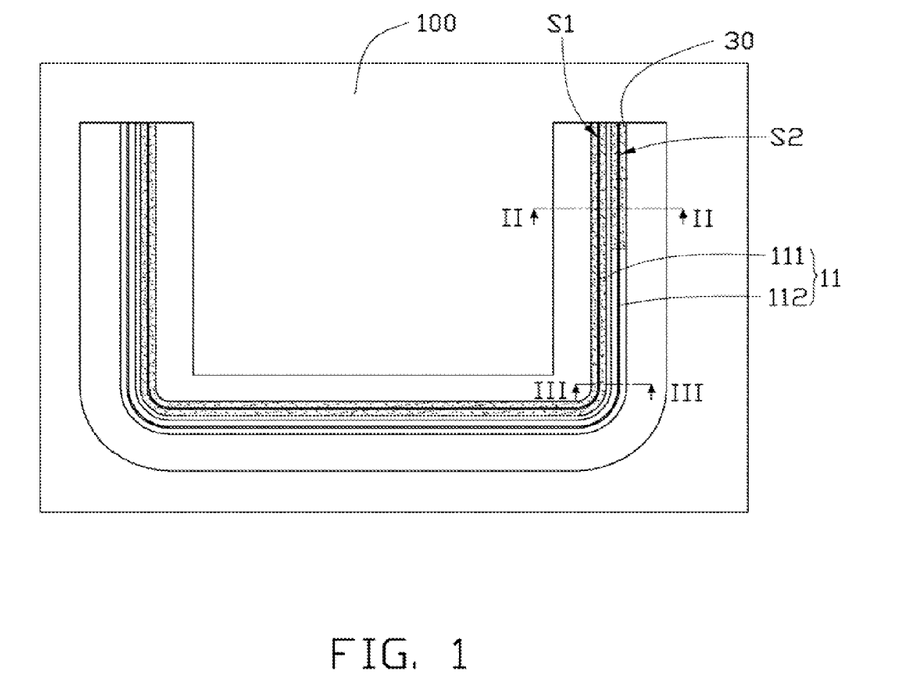
FIG. 1 is a schematic diagram of a differential signal transmission cable as disclosed.
Figure 2:
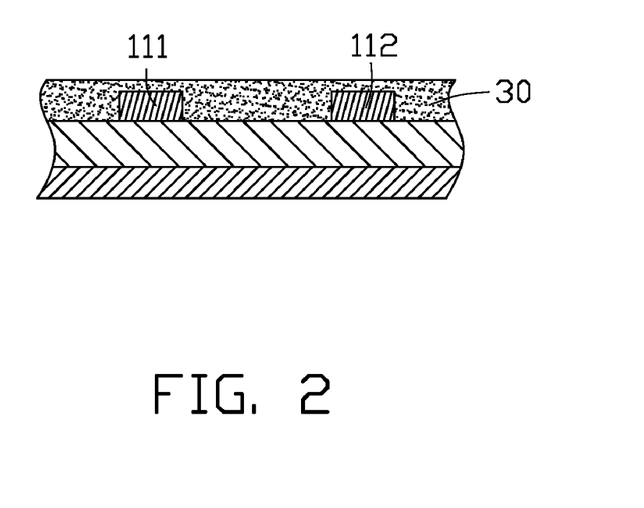
FIG. 2 is sectional view taken along the line II-II of FIG. 1.
Figure 3:
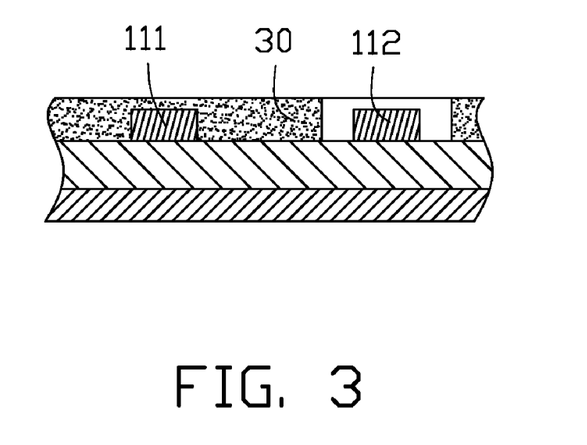
FIG. 3 is sectional view taken along the line III-III of FIG. 1.

Referring to FIGS. 1-3, a differential signal transmission cable 11 is deployed on a printed circuit board (PCB) 100 as shown in FIG. 1. The differential signal transmission cable 11 includes a first transmission line 111 and a second transmission line 112. Lengths of the first transmission line 111 and the second first transmission line 112 are denoted as S1 and S2 respectively, wherein, S1<S2, for example. In another example, S1>S2. Transmission speed and transmission time of a signal in a transmission line can be expressed as follows:

$$V = \frac{C}{\sqrt{\varepsilon}} \quad (1)$$

$$t = \frac{S}{V} \quad (2)$$

where V and t are a transmission speed and a transmission time of a signal in a transmission line respectively; C is velocity of light, ∈ and S are a permittivity value and a length of the corresponding transmission line respectively. According to the formulae (1) and (2), the transmission time t can be changed by adjusting the permittivity value ∈.

In order to compensate for transmission time difference of a first signal transmitted through the first transmission line 111 and a second signal transmitted through the second transmission line 112, a solder mask 30 is disposed on and along, the entire length of the first transmission line 111, and disposed on a local portion of the second transmission line 112. Length percents of a portion having the solder mask 30 and a portion without the solder mask 30 of the second transmission line 112 can be denoted as X and Y respectively, wherein X+Y=1, In the following as shown in FIG. 3, a portion having the solder mask 30 and a portion without the solder mask 30 of the second transmission line 112 are referred to as the first portion and the second portion respectively.

As shown in FIG. 2, the solder mask 30 is disposed on outside surfaces of the first transmission line 111 and the second transmission line 112. As shown in FIG. 3, the solder mask 30 is only disposed on the outside surface of the first transmission line 111.

According to the formulae (1) and (2), when a transmission time t1 of the first signal in the first signal transmission line 111 is substantially equal to a transmission time t2 of the second signal in the second signal transmission line 112, the relationship between the length percents X and Y can be denoted as:

$$\frac{S1\sqrt{\varepsilon 1}}{C} = \frac{S2 \times X \sqrt{\varepsilon 1}}{C} + \frac{S2 \times Y \sqrt{\varepsilon 2}}{C} \quad (3)$$

where $\frac{S2 \times X \sqrt{\varepsilon 1}}{C}$ and $\frac{S2 \times Y \sqrt{\varepsilon 2}}{C}$ are the transmission time of the second signal in the first and second portions respectively, ∈1 is a permittivity value of the first transmission line 111 and the first portion of the second transmission line 112, and ∈2 is a permittivity value of the second portion of the second transmission line 112, wherein ∈2<∈1. It is understood that the relationship between the permittivity values ∈1 and ∈2 can be denoted as: S1√∈1=S2√∈2 when the second transmission line 112 includes only permittivity value ∈2.

Transmission speeds of the first signal in the first transmission line 111 and the second signal in the first portion can be denoted as V1. A transmission speed of the second signal in the second portion can be denoted as V2, V1<V2 because of ∈2<∈1.

Because the transmission speed V1 of the first signal in the first signal transmission line 111 is less than the transmission speed V2 of the second signal in the second portion, the transmission time t1 of the first signal in the first signal transmission line 111 exceeds the transmission time t2 of the second signal in the second signal transmission line 112. Thus, a length offset between the first transmission line 111 and the second transmission line 112 can be compensated. Accordingly, the first and second signals can arrive at a reception terminal of the differential signal transmission cable 11 at substantially the same time. It is understood that the solder mask 30 can comprise other dielectric materials, and different dielectric materials may be disposed over a local portion or the entire length of the first and second transmission lines 111, 112 to achieve a purpose of the disclosure.

Figure 4:
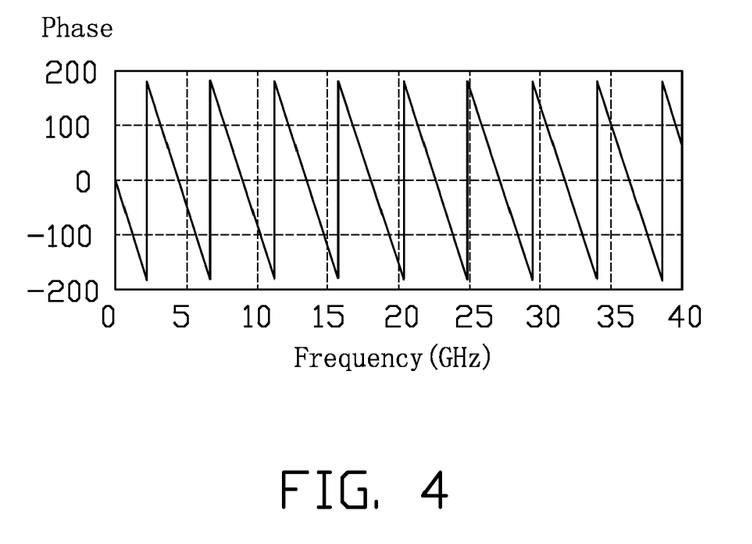
FIG. 4 is a phase diagram of a differential signal pair at a reception terminal of the differential signal transmission cable of FIG. 1.
Figure 5:
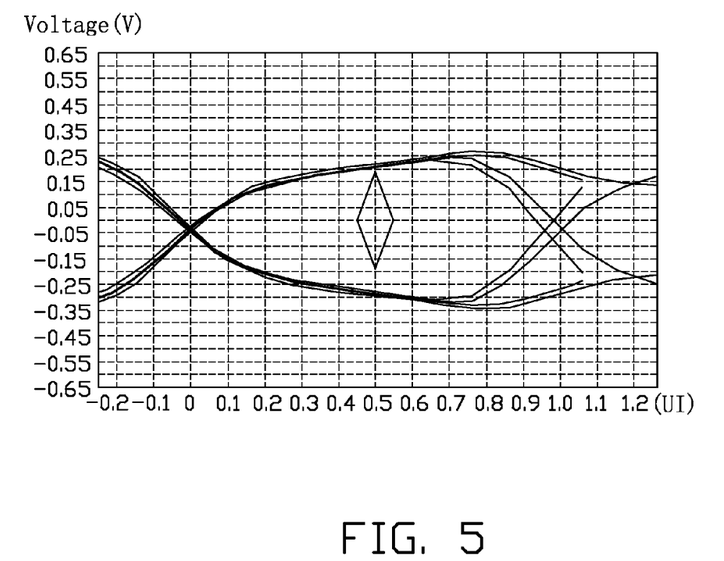
FIG. 5 is an eye diagram of the differential signal pair at the reception terminal of the differential signal transmission cable of FIG. 1.

Referring to FIG. 4, a phase diagram of the first and second signals at the reception terminal of the differential signal transmission cable 11 is shown. The phase curves of the first and second signals coincide with each other. That is the phase difference of the first and second signals at the reception terminal of the differential signal transmission cable 11 is zero, which indicates that the first and second signals arrive at the reception terminal of the differential signal transmission cable 11 at substantially the same time. Referring to FIG. 5, an eye diagram of the first and second signals at the reception terminal of the differential signal transmission cable 11 shows that bit error rate in transmission is low as shown between −0.2 and −0.1 unit interval.

Figure 6:
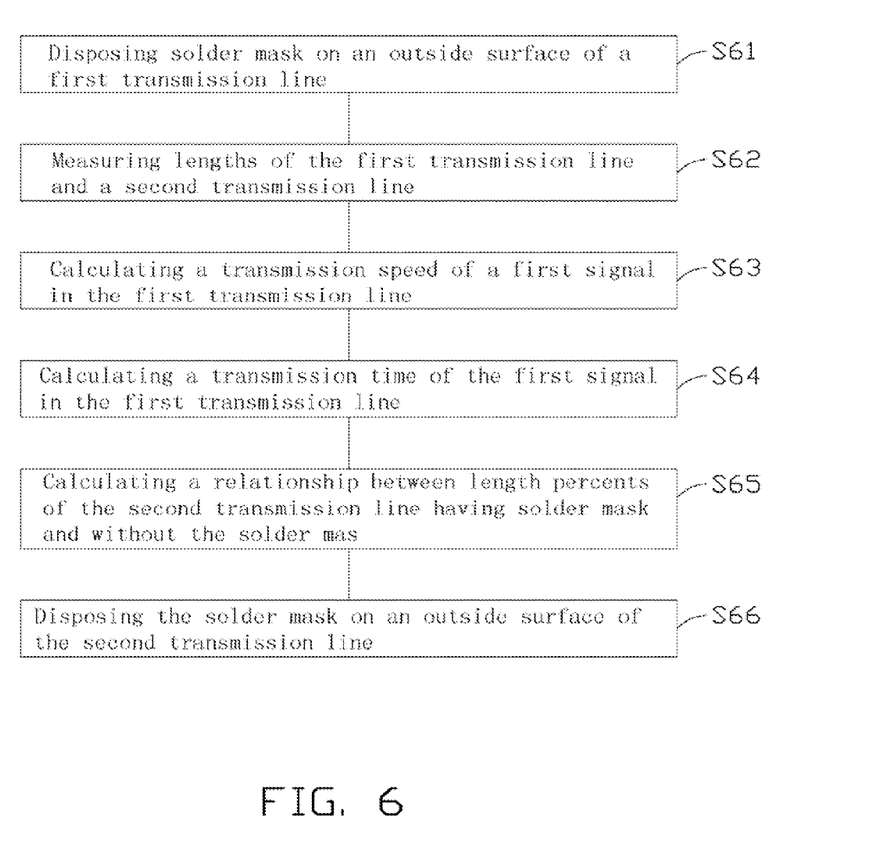
FIG. 6 is a flowchart of a first embodiment of a method for compensating a length offset of a differential signal transmission cable.

Referring to FIG. 6, a first embodiment of a method for compensating a length offset between the first transmission line 111 and the second transmission line 112 includes the following.

In step S61, the solder mask 30 is disposed on the outside surface of the first transmission line 111.

In step S62, the lengths of the first transmission line 111 and the second transmission line 112 are measured.

In step S63, the transmission speed of the first signal in the first transmission line 111 is calculated according to formula (1).

In step S64, the transmission time t1 of the first signal in the first transmission line 111 is calculated according to formula (2).

In step S65, a relationship between the length percent X of the first portion of the second transmission line 112 having the solder mask 30 and the length percent Y of the second portion of the second transmission line 112 without the solder mask 30 are calculated according to formula (3).

In step S66, the solder mask 30 is disposed on the outside surface of the first portion of second transmission line 112 according to the length percents X and Y.

Figure 7:
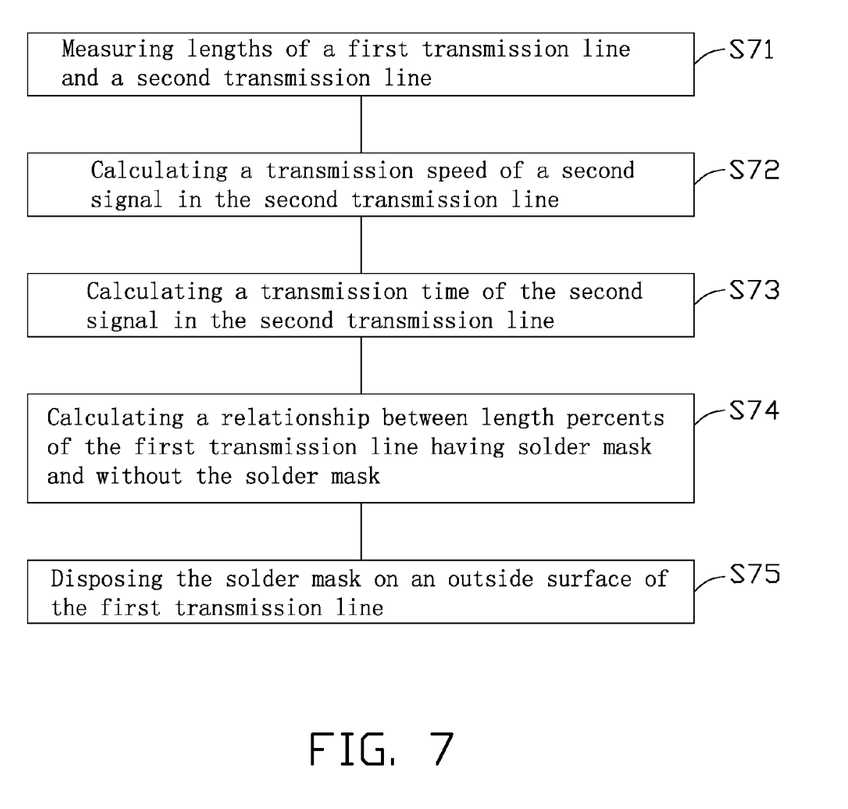
FIG. 7 is a flowchart of a second embodiment of a method for compensating a length offset of a differential signal transmission cable.

Referring to FIG. 7, a second embodiment of a method for compensating a length offset between the first transmission line 111 and the second transmission line 112 includes the following.

In step S71, lengths of the first transmission line 111 and the second transmission line 112 are measured.

In step S72, the transmission speed V2 of the second signal in the second transmission line 112 is calculated according to formula (1).

In step S73, the transmission time t2 of the second signal in the second transmission line 112 is calculated according to formula (2).

In step S74, a relationship between the length percent X of the first transmission line 111 having the solder mask 30 and the length percent Y of the first transmission line 111 without the solder mask 30 are calculated according to formula (3).

In step S75, the solder mask 30 is disposed on the outside surface of the first transmission line 111 according to the length percents X and Y.

It is to be understood, however, that even though numerous characteristics and advantages of the embodiments have been set forth in the foregoing description, together with details of the structure and function of the embodiments, the disclosure is illustrative only, and changes may be made in details, especially in matters of shape, size, and arrangement of parts within the principles of the embodiments to the full extent indicated by the broad general meaning of the terms in which the appended claims are expressed.

What is claimed is:

1. A differential signal transmission cable, comprising:
    a first signal transmission line having a first permittivity value and a first length; and
    a second signal transmission line having a second length, wherein the second signal transmission line comprises a first portion with a second permittivity value and a second portion with a third permittivity value, wherein length percents of the first portion and the second portion are denoted as X and Y respectively, wherein the first permittivity value, the second permittivity value, the third permittivity value, the first length, and the second length are denoted as $\in1$, $\in2$, $\in3$, S1, and S2 respectively, and the relationship among the first permittivity value, the second permittivity value, the third permittivity value, the first length, and the second length is:

$$S1\sqrt{\in1} = S2 \times X\sqrt{\in2} + S2 \times Y\sqrt{\in3}.$$

2. The differential signal transmission cable of claim 1, wherein the third permittivity value $\in3$ is substantially equal to the first permittivity value $\in1$.

3. A method for compensating a length offset between a first transmission line and a second transmission line of a differential transmission cable of a printed circuit board, the method comprising:
    calculating a transmission speed of a first signal in the first transmission line;
    measuring lengths of the first and second transmission lines;
    calculating a transmission time of the first signal in the first transmission line;
    calculating a relationship between a permittivity value of the first transmission line and a permittivity value of the second transmission line based on the transmission time of the first signal in the first transmission line being substantially equal to a transmission time of a second signal in the second transmission line; and
    changing the permittivity value of the first transmission line and/or the permittivity value of the second transmission line according to the relationship;
    wherein the changing of the permittivity value is achieved by disposing a first dielectric material over the first and/or the second transmission lines; and
    wherein the chaining of the permittivity value is further achieved by disposing a second dielectric material over a local portion or the entire length of the first and second transmission lines, wherein the first dielectric material is different from the second dielectric material.

4. The method of claim 3, wherein the changing of the permittivity value is further achieved by disposing the first dielectric material over the entire length of the first transmission line and a local portion of the second transmission line.

5. The method of claim 4, wherein the first dielectric material is a solder mask.

6. The method of claim 4, wherein the transmission time of the first signal in the first transmission line is calculated by the formula:

$$V1 = \frac{C}{\sqrt{\varepsilon 1}}, \, t1 = \frac{S1}{V1},$$

where V1 and t1 are the transmission speed and time of the first signal in the first transmission line respectively, C is velocity of light, and ∈1 and S1 are the permittivity value and length of the first transmission line respectively.

7. The method of claim 6, wherein length percents of a first portion having solder mask and a second portion without solder mask of the second signal transmission line are denoted as X and Y respectively, and the relationship with the percent X and Y can be denoted as formula: $S1\sqrt{\in 1}=S2\times X\sqrt{\in 1}+S2\times Y\sqrt{\in 2}$, wherein ∈2 is a permittivity value of the second portion without solder mask of the second signal transmission line, S2 is the length of the second transmission line.

8. A differential signal transmission cable of a printed circuit board, comprising:

a first signal transmission line having a first permittivity value and a first length; and a second signal transmission line having a second permittivity value and a second length;

wherein the first permittivity value, the second permittivity value, the first length, and the second length are denoted as ∈1, ∈2, S1 and S2 respectively, and the relationship among the first permittivity value, the second permittivity value, the first length, and the second length is:

$$S1\sqrt{\in 1}=S2\sqrt{\in 2};$$

wherein disposing a dielectric material over different lengths of the first transmission line and the second transmission line for changing the first and the second permittivity value when the first length is different from the second length.

\* \* \* \* \*